(12) United States Patent
Matsushita (10) Patent No.: US 11,625,080 B2
(45) Date of Patent: Apr. 11, 2023

(54) ELECTRONIC APPARATUS, FAN CONTROL METHOD, AND RECORDING MEDIUM

(71) Applicant: Hitachi, Ltd., Tokyo (JP)

(72) Inventor: Tsubasa Matsushita, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 144 days.

(21) Appl. No.: 17/196,029

(22) Filed: Mar. 9, 2021

(65) Prior Publication Data

US 2022/0075433 A1 Mar. 10, 2022

(30) Foreign Application Priority Data

Sep. 7, 2020 (JP) .............................. JP2020-150169

(51) Int. Cl.
*G06F 1/20* (2006.01)
*G06F 11/30* (2006.01)
*H05K 7/20* (2006.01)

(52) U.S. Cl.
CPC .......... *G06F 1/206* (2013.01); *G06F 11/3058* (2013.01); *H05K 7/20136* (2013.01); *H05K 7/20209* (2013.01)

(58) Field of Classification Search
None
See application file for complete search history.

(56) References Cited

U.S. PATENT DOCUMENTS

2015/0378404 A1* 12/2015 Ogawa .................... G05B 15/02
                                                                    700/300
2021/0306538 A1*  9/2021 Solar ..................... H05K 7/2039

FOREIGN PATENT DOCUMENTS

| JP | 2006202898 A | * | 8/2006 | ......... G05D 23/1913 |
| JP | 6589299 B2 | | 10/2019 | |
| JP | 2005004675 A | * | 10/2019 | |
| WO | WO-2020208726 A1 | * | 10/2020 | |

* cited by examiner

*Primary Examiner* — Isaac Tuku Tecklu
(74) *Attorney, Agent, or Firm* — Procopio, Cory, Hargreaves & Savitch LLP (57) ABSTRACT

A microcomputer calculates a predicted CPU ambient temperature which predicts an ambient temperature in the future by using a heat generation amount of a drive, an outside air temperature detected by an outside air temperature sensor, and a CPU ambient temperature detected by a CPU ambient temperature sensor. The microcomputer controls a rotation number of the fan on the basis of the predicted CPU ambient temperature so that a junction temperature of a CPU does not exceed a temperature-specification upper limit value.

8 Claims, 10 Drawing Sheets

FIG. 2

| Mounting position 201 | Type 202 | Power consumption [W] 203 | Contributing heat quantity [W] 204 |
|---|---|---|---|
| #1 | Drive model name A | 7 | 7×l1×a |
| #2 | Drive model name B | 22 | 22×l2×b |
| ... | ... | ... | ... |
| #24 | Drive model name C | 25 | 25×l24×c |

200 Drive information table

FIG. 3

| Mounting position | Mounting position coefficient |
|---|---|
| #1 | I1 |
| #2 | I2 |
| ... | ... |
| #24 | I24 |

300 Mounting position coefficient table

FIG. 4

400 Heat generation coefficient table

FIG. 5

| Duty ratio (%) | Predicted CPU ambient temperature | CPU ambient temperature rise amount | Predicted CPU junction temperature |
|---|---|---|---|
| 28 (low speed) | 70 | 20 | 90 |
| 55 (medium speed) | 60 | 10 | 80 |
| 73 (high speed) | 50 | 0 | 70 |
| 99 (super-high speed) | 40 | -10 | 60 |

500 CPU temperature change prediction table

FIG. 6

600 Fan air flow table

ELECTRONIC APPARATUS, FAN CONTROL METHOD, AND RECORDING MEDIUM

CROSS-REFERENCE TO PRIOR APPLICATION

This application relates to and claim the benefit of priority from Japanese Patent Application No. 2020-150169 filed on Sep. 7, 2020 the entire disclosure of which is incorporated herein by reference.

BACKGROUND

The present disclosure relates to a technology for controlling a fan.

Regarding a cooling mechanism of an electronic apparatus such as a storage apparatus, those employing a feedback method for controlling a rotation number of a cooling fan so that a temperature of a temperature control target becomes equal to or smaller than a temperature-specification upper limit value by acquiring information related to the temperature of the temperature control target such as a CPU (Central Processing Unit) and by feeding back the acquired information are known.

Description in the Japanese Patent No. 6589299, for example, discloses a cooling control device for an extension card inserted in a slot as a temperature control target. This cooling control device controls a rotation number of the cooling fan on the basis of power consumption of the slot.

SUMMARY

Recently, a type of storage apparatus accommodating a storage drive storing data and a controller for controlling the storage drive in a single enclosure is mainstream. In this type of storage apparatus, the storage drive becomes a heat source, and a temperature of a temperature control target such as a CPU in the controller rises by the heat in some cases. In the storage apparatus in which the storage drive is disposed on a side of an inlet for taking in air to be blown by a cooling fan, for example, cooling power for the temperature control target is weakened since the temperature control target is cooled by air warmed by the heat of the storage drive, and the temperature of the temperature control target tends to be high. Particularly in line with a trend to higher performance of the storage apparatus, an NVMe (Non-Volatile Memory Express) I/F with large power consumption and heat generation amount is increasingly employed as a communication I/F of the storage drive, instead of a conventional SAS (Serial Attached SCSI (Small-Computer System Interface)) I/F and thus, the heat of the storage drive cannot be ignored anymore.

However, in the cooling mechanism employing the feedback method such as the cooling control apparatus described in the Japanese Patent No. 6589299, information related to the temperature of the temperature control target is only fed back and an influence by a heat source other than the temperature control target is not considered and thus, there is a problem that the temperature of the temperature control target exceeds the temperature-specification upper limit value depending on a state of the heat source.

In addition, the rotation number of the cooling fan can be kept high so that the temperature of the temperature control target is maintained equal to or smaller than the temperature-specification upper limit value even if the state of the heat source is fluctuated, but with this method, the cooling fan is excessively rotated when the heat generation amount of the heat source is small, and a noise caused by the cooling fan becomes larger than necessary, which is not realistic.

An object of the present disclosure is to provide an electronic apparatus, a fan control method, and a program which can control the temperature of the temperature control target as appropriate even if a heat source is present.

An electronic apparatus according to one aspect of the present disclosure has a heat source, a temperature control target, a cooling fan configured to send outside air to the temperature control target, an outside air temperature detection unit configured to detect a temperature of the outside air, an ambient temperature detection unit configured to detect a temperature around the temperature control target, and a control unit configured to calculate a predicted ambient temperature which predicts an ambient temperature in the future by using a heat generation amount of the heat source, the outside air temperature, and the ambient temperature and to control a rotation number of the cooling fan on the basis of the predicted ambient temperature such that the temperature of the temperature control target does not exceed a temperature-specification upper limit value.

According to the present disclosure, the temperature of the temperature control target can be controlled as appropriate even if a heat source is present.

DETAILED DESCRIPTION OF THE EMBODIMENT

An embodiment of the present disclosure will be described below by referring to the drawings.

Figure 1:
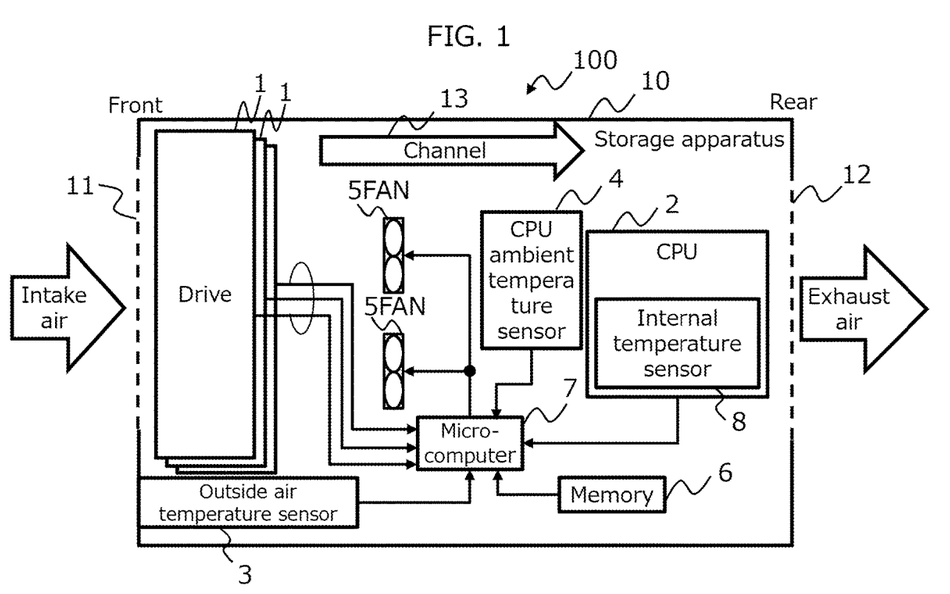
FIG. 1 is a diagram schematically illustrating configuration of a storage apparatus of an embodiment of the present disclosure.

FIG. 1 is a diagram schematically illustrating configuration of a storage apparatus of an embodiment of the present disclosure. The storage apparatus 100 illustrated in FIG. 1 is an electronic apparatus storing data, has a drive (Drive) 1, a CPU 2, an outside air temperature sensor 3, a CPU ambient temperature sensor 4, a fan (FAN) 5, a memory 6, and a microcomputer 7, and each of the constituent elements 1 to 7 is accommodated in an enclosure 10.

The drive 1 is a storage drive for storing data and functions as a heat source. A heat generation amount of the drive 1 changes in accordance with a type and power consumption of the drive 1. The power consumption of the drive 1 is changed in accordance with a quantity of an I/O request requesting read/write of data and the like, for example.

There may be a plurality of drives 1. In this Embodiment, the storage apparatus 100 has a plurality of mounting slots (not shown) for mounting the drive 1, and at least one of the mounting slots has the drive mounted. The number of the mounting slots is not particularly limited but it is assumed to be 24 in the following.

The CPU 2, the outside air temperature sensor 3, the CPU ambient temperature sensor 4, the fan 5, the memory 6, and the microcomputer 7 constitute a storage controller for controlling the drive 1.

The CPU 2 is a processor for controlling read/write of data with respect to the drive 1 and is a temperature control target whose temperature is to be controlled. The CPU 2 includes an internal temperature sensor 8 which is an internal temperature detection unit for detecting a junction temperature which is an internal temperature of the CPU 2.

The outside air temperature sensor 3 is an outside air temperature detection unit for detecting an outside air temperature which is a temperature of outside air (air outside the enclosure 10). The CPU ambient temperature sensor 4 is an ambient temperature detection unit for detecting a CPU ambient temperature which is a temperature around the CPU 2.

The fan 5 is a cooling fan for sending the outside air to the CPU 2. In FIG. 1, two units of the fans 5 are illustrated, but the number of the fans 5 may be one or three or more.

In this Embodiment, an inlet 11 for taking in the outside air to be sent to the CPU 2 by the fan 5 is provided on a front surface side of the enclosure 10, and an outlet 12 for exhausting the taken-in outside air is provided on a rear surface side of the enclosure 10. The drive 1 is provided closer to the inlet 11 side than the CPU 2 in a channel 13 through which the outside air passes. That is, the drive 1 is provided between the inlet 11 and the CPU 2 in the channel 13. Positional relationships of the other constitutions are not particularly limited. For example, the fans 5 are provided between the drive 1 and the CPU 2 in the example in FIG. 1, but they may be provided closer to the front surface side than the drive 1 or closer to the rear surface side than the CPU 2.

The memory 6 stores programs defining operations of the CPU 2 and the microcomputer 7 and various types of information used in the CPU 2 and the microcomputer 7. For example, the memory 6 stores management information (FIGS. 2 to 6) required for fan control processing for controlling the fan 5 by the microcomputer 7. The management information has a drive information table (FIG. 2) related to the drive 1, a mounting position coefficient table (FIG. 3) related to a mounting position of the drive 1, a heat generation coefficient table (FIG. 4) related to heat generation of the drive 1, a CPU temperature change prediction table (FIG. 5) related to change prediction of the junction temperature of the CPU 2, and a fan air flow table (FIG. 6) related to an air flow of the fan 5.

The microcomputer 7 is a control unit for executing various types of processing including the fan control processing by reading the program stored in the memory 6 and by executing the read program.

In the fan control processing, the microcomputer 7 first calculates a predicted CPU ambient temperature which is a predicted ambient temperature in the future on the basis of the heat generation amount of the drive 1, the outside air temperature detected by the outside air temperature sensor 3, and the CPU ambient temperature detected by the CPU ambient temperature sensor 4. Subsequently, the microcomputer 7 determines the rotation number of the fan 5 on the basis of the predicted CPU ambient temperature so that the junction temperature which is the internal temperature of the CPU 2 does not exceed the temperature-specification upper limit value and controls the fan 5.

In this Embodiment, the heat generation amount of the drive 1 is calculated by a state of the drive 1 and the management information stored in the memory 6. The temperature-specification upper limit value is determined in advance in accordance with the CPU 2. The control of the fan 5 by the microcomputer 7 is PWM control for controlling the rotation number of the fan 5 by outputting a PWM (Pulse Width Modulation) signal to the fan 5. Thus, the rotation number of the fan 5 is changed in accordance with a duty (Duty) ratio of the PWM signal.

FIGS. 2 to 6 are diagrams illustrating an example of each information included in the management information stored in the memory 6.

Figure 2:
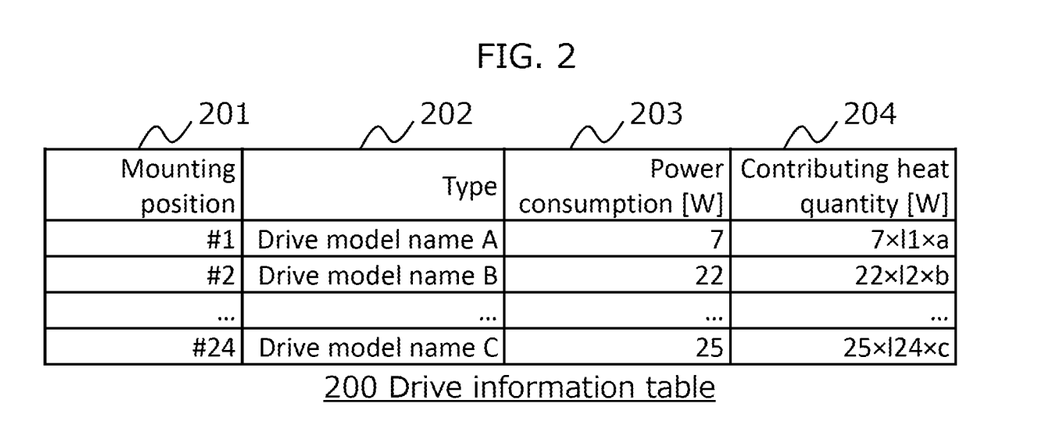
FIG. 2 is a diagram illustrating an example of a drive information table.

FIG. 2 is a diagram illustrating an example of the drive information table. The drive information table 200 illustrated in FIG. 2 includes fields 201 to 204. The field 201 stores a mounting position of the drive 1. In this Embodiment, slot numbers for identifying mounting slots in which the drive 1 is mounted are stored as the mounting positions. The slot numbers are indicated by numerals from #1 to #24. The positional relationship between the drive 1 and the CPU 2 is changed in accordance with the mounting position of the drive 1, and a contributing heat amount contributing to the predicted CPU ambient temperature in the heat generation amount of the drive 1 is changed. The field 202 stores a type of the drive 1. The field 203 stores power consumption of the drive 1. The field 204 stores the contributing heat generation amount. A specific calculation method of the contributing heat amount will be described later.

Figure 3:
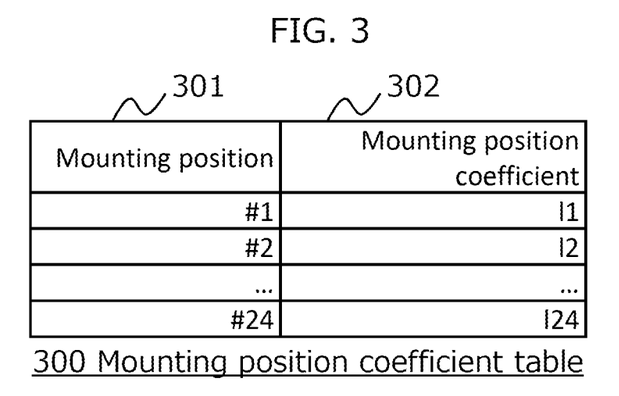
FIG. 3 is a diagram illustrating an example of mounting position coefficient table.

FIG. 3 is a diagram illustrating an example of a mounting position coefficient table. The mounting position coefficient table 300 illustrated in FIG. 3 has fields 301 and 302. The field 301 stores the slot number as a storage position of the drive 1. The field 302 stores a mounting position coefficient which is a coefficient for calculating a contributing heat amount according to the mounting position of the drive 1. The mounting position coefficient is stored in the mounting position coefficient table 300 in advance by calculating a contributing heat amount according to the mounting position by actual measurement or the like, for example.

Figure 4:
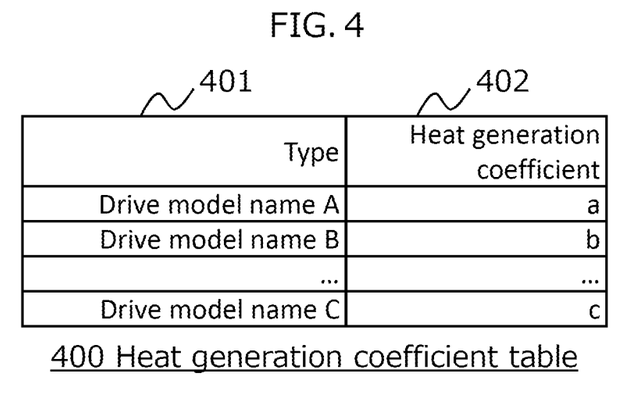
FIG. 4 is a diagram illustrating an example of a heat generation coefficient table.

FIG. 4 is a diagram illustrating an example of heat generation coefficient table. The heat generation coefficient table 400 illustrated in FIG. 4 has fields 401 and 402. The field 401 stores the type of the drive 1. The field 402 stores a heat generation coefficient indicating a heat generation amount per unit of electric power according to the type. The heat generation coefficient can be calculated by acquiring a heat generation amount to power consumption for each type of the drive 1 by actual measurement, for example, and is stored in the heat generation coefficient table 400 in advance.

Figure 5:
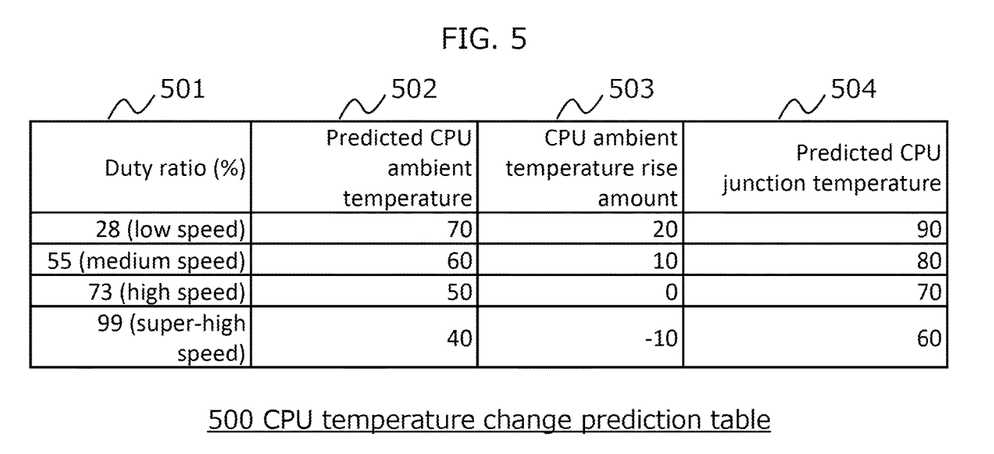
FIG. 5 is a diagram illustrating an example of a CPU temperature change prediction table.

FIG. 5 is a diagram illustrating an example of a CPU temperature change prediction table. The CPU temperature change prediction table 500 illustrated in FIG. 5 includes fields 501 to 504. The field 501 stores a duty ratio of the PWM signal output to the fan 5 as rotation number information indicating the rotation number of the fan 5. In this Embodiment, the microcomputer controls the rotation number of the fan 5, that is, a duty ratio of the PWM signal in a plurality of stages. Here, the microcomputer 7 controls the fan 5 in four stages, that is, a low speed, a medium speed, a high speed, and a super-high speed from the lower rotation number of the fan 5, and duty ratios according to each of the stages are set to 28, 55, 73, and 99. The field 502 stores a predicted CPU ambient temperature which is a predicted value of the CPU ambient temperature. The field 503 stores a CPU ambient temperature rise amount which is a predicted value of a rise amount of the CPU ambient temperature. The field 504 stores a predicted CPU junction temperature which is a predicted value of a junction temperature of the CPU 2.

Figure 6:
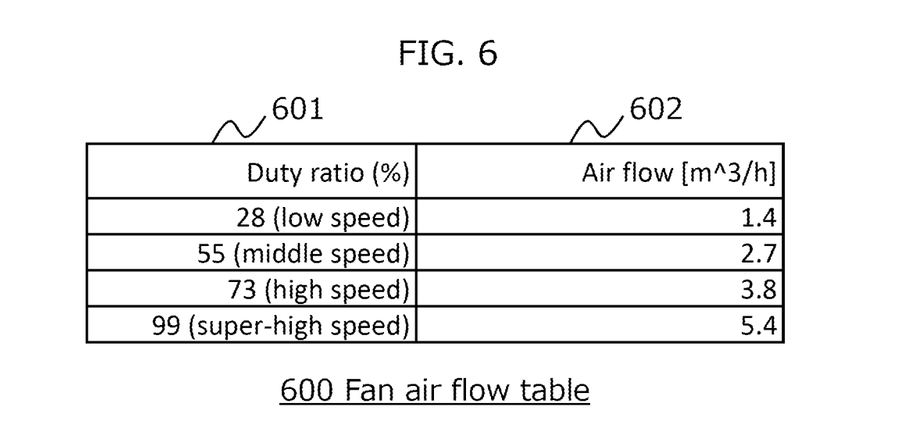
FIG. 6 is a diagram illustrating an example of a fan air flow table.

FIG. 6 is a diagram illustrating an example of a fan air volume table. The fan air flow table 600 illustrated in FIG. 6 has fields 601 and 602. The field 601 stores a duty ratio of the PWM signal. The field 602 stores an air flow of the fan 5 according to the duty ratio. The air flow of the fan 5 can be acquired in accordance with the duty ratio by actual measurement, for example, and is stored in the fan air flow table 600 in advance. When there are a plurality of the fans 5, the total sum of the air flows of the fans 5 is stored in the field 602.

Figure 7:
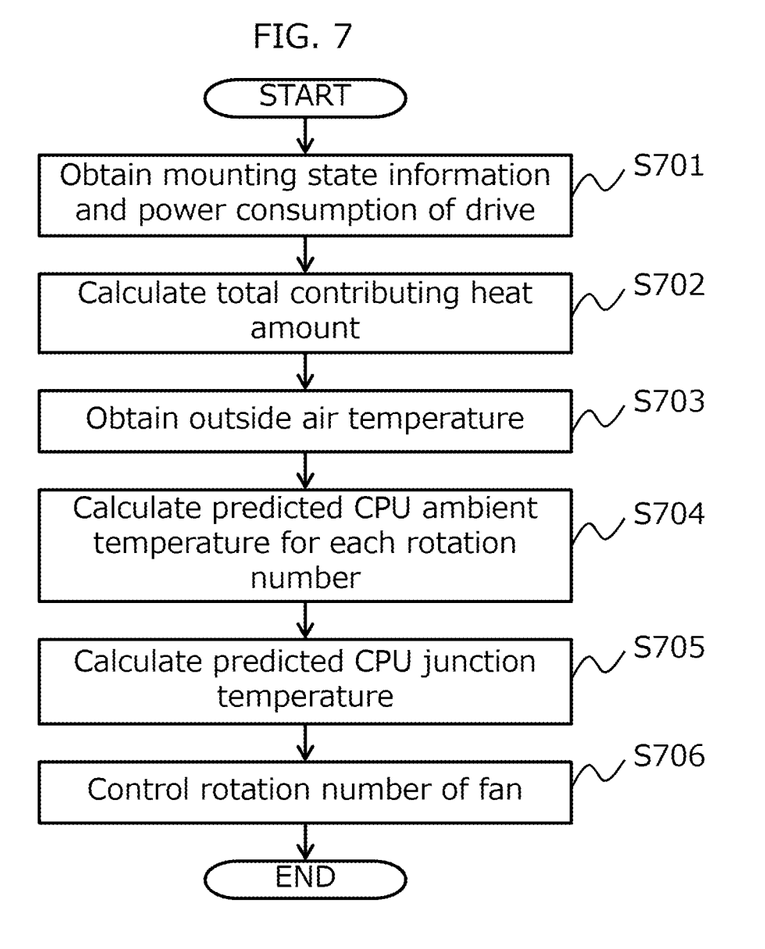
FIG. 7 is a flowchart for explaining an example of an operation of a microcomputer.

FIG. 7 is a flowchart for explaining an example of an operation of the microcomputer 7.

First, the microcomputer 7 acquires a mounted state information of the drive 1 and power consumption of each drive 1 (Step S701). The mounted state information is information indicating a mounting slot in which the drive 1 is mounted, for example.

Subsequently, the microcomputer 7 calculates a contributing heat amount of the entire drive 1 as a total contributing heat amount on the basis of the mounted state information and power consumption acquired at Step S701 and the management information stored in the memory 6 (Step S702).

Moreover, the microcomputer 7 obtains an outside air temperature from an outside air temperature sensor 3 (Step S703).

Then, the microcomputer 7 calculates a predicted CPU ambient temperature for each stage of the rotation number of the fan 5 on the basis of the total contributing heat amount calculated at Step S702, the outside air temperature obtained at Step S703, and the management information stored in the memory 6 (Step S704).

Moreover, the microcomputer 7 calculates a predicted CPU junction temperature for each stage of the rotation number of the fan 5 on the basis of each predicted CPU ambient temperature calculated at Step S703 (Step S705).

Then, the microcomputer 7 controls the rotation number of the fan 5 (Step S706) so that the junction temperature of the CPU 2 does not exceed a temperature-specification upper limit value on the basis of the predicted CPU junction temperature calculated at Step S704 and finishes the processing.

Figure 8:
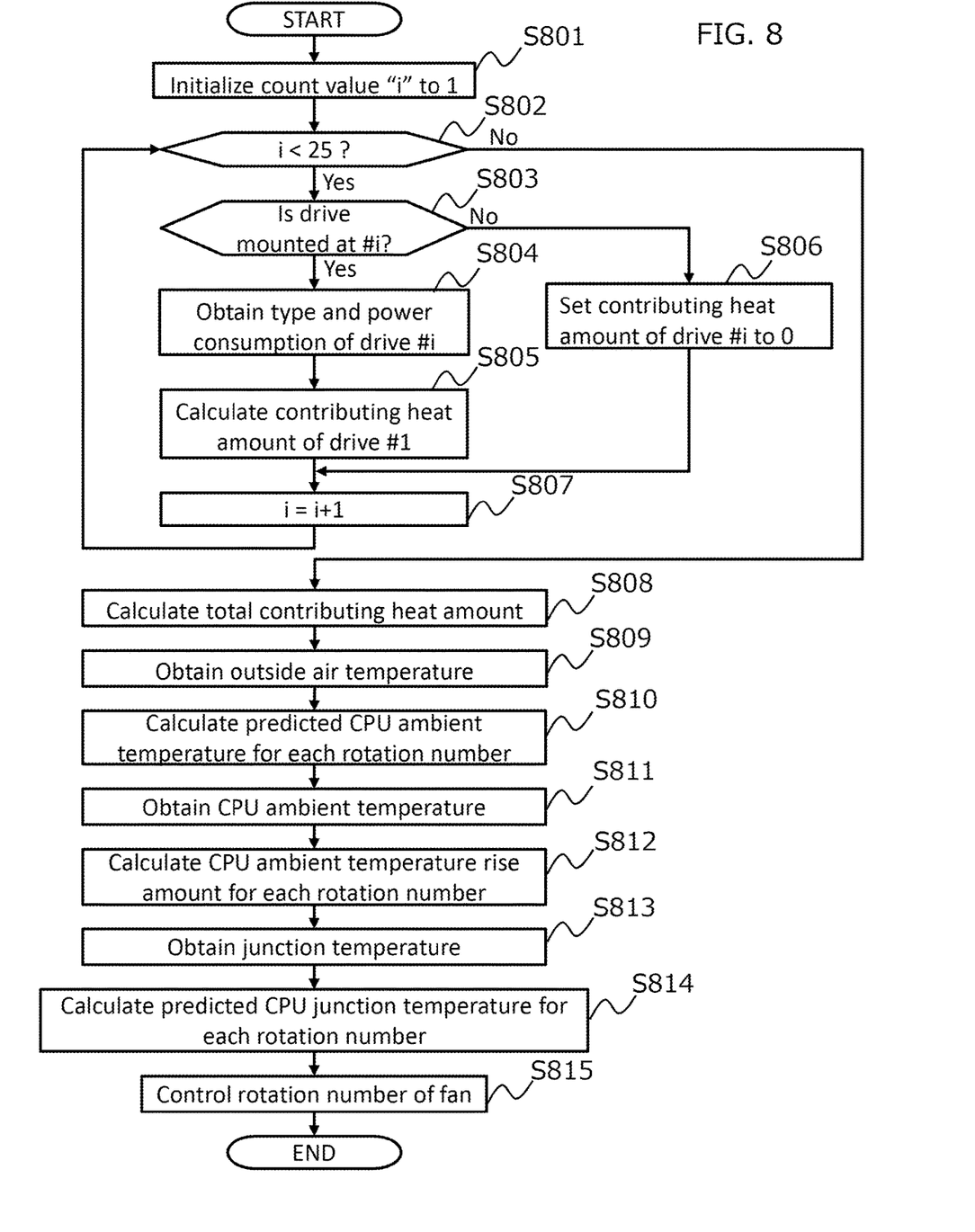
FIG. 8 is a flowchart for explaining a more detailed example of the operation of the microcomputer.

FIG. 8 is a flowchart for explaining an operation of the microcomputer 7 in more detail. Correspondence relationships between Steps S701 to S706 explained by using FIG. 7 and Steps S801 to S815 which will be explained by using FIG. 8 are as follows. That is, Step S701 corresponds to Steps S801 to S807, Step S702 corresponds to Step S808, Step S703 corresponds to Step S809, Step S704 corresponds to Step S810, Step S705 corresponds to Steps S811 to S814, and Step S706 corresponds to Step S815.

First, the microcomputer 7 initializes a count value "i" for counting the slot number of the mounting slot in which the drive 1 is mounted to "1" (Step S801). The microcomputer 7 determines whether the current count value "i" is less than a threshold value obtained by adding "1" to the maximum value of the slot number or not (Step S802). In this Embodiment, the slot numbers are #1 to #24 and thus, the threshold value is "25".

When the count value "i" is less than the threshold value (Step S802: Yes), the microcomputer 7 determines whether the drive 1 is mounted in the mounting slot with the target slot number #i which is the same slot number as the count value "i" or not (Step S803).

When the drive 1 is mounted in the mounting slot with the target slot number "i" (Step S803: Yes), the microcomputer 7 obtains the type of a target drive which is the drive 1 and current power consumption. The microcomputer 7 associates the obtained type and power consumption to the target slot number "i" and stores it in the drive information table 200 stored in the memory 6 (Step S804). The type of the drive 1 can be obtained from the drive 1 itself, for example. The power consumption of the drive 1 can be obtained from a power supply control apparatus (not shown) for controlling power to be supplied to the drive 1, for example. Moreover, the power consumption of the drive 1 may be obtained from the drive 1 itself.

The microcomputer 7 calculates the contributing heat amount of the target drive on the basis of the drive information table 200, the mounting position coefficient table 300, and the heat generation coefficient table 400 stored in the memory 6, associates it with the target slot number "i", and stores it in the drive information table 200 stored in the memory 6 (Step S805). The contributing heat amount can be calculated by a product of power consumption, the mounting position coefficient, and the heat generation coefficient. In the case where the mounting position is "#1" and the type of the drive is "Drive model name A" in the example in FIGS. 2 to 4, for example, the contributing heat amount is 7 (power consumption)×11 (mounting position coefficient)×a (heat generation coefficient).

Moreover, when the drive 1 is not mounted in the mounting slot with the target slot number "i" (Step S803: No), the microcomputer 7 calculates the contributing heat amount of the target drive as "0" instead of executing processing at Steps S804 and S805, associates it with the target slot number "i", and stores it in the drive information table 200 stored in the memory 6 (Step S806).

When Step S805 or S806 is finished, the microcomputer 7 increments a count value (Step S807) and returns to processing at Step S802.

Then, when a count value becomes equal to or larger than the threshold value at Step S802 (Step S802: No), the microcomputer 7 calculates the total sum of the contributing heat amounts in the drive information table 200 stored in the memory 6 as a total contributing heat amount (Step S808). Moreover, the microcomputer 7 obtains an outside air temperature from the outside air temperature sensor 3 (Step S809).

The microcomputer 7 calculates a predicted CPU ambient temperature for each step of the rotation number of the fan 5 on the basis of the total contributing heat amount, the outside air temperature, and the fan air flow table 600 stored in the memory 6 and stores it in the CPU temperature change prediction table 500 stored in the memory 6 (Step S810).

The predicted CPU ambient temperature can be calculated by using the following formula (1), for example:

$$t_2 = \frac{60 \times q}{Q \rho C_p} + t_1 [K] \tag{1}$$

In the formula (1), q denotes the total contributing heat amount [w], Q denotes an air flow [m³/h] of the fan 5, p denotes air density [kg/m³], $C_p$ denotes a constant pressure specific heat of the air [J/kgK], $t_1$ is an outside air temperature [K], and $t_2$ is a predicted CPU ambient temperature. A unit of each value is only an example and is not limiting. Moreover, the air density p and the constant pressure specific heat $C_p$ are actually changed in accordance with a temperature but may be handled as fixed values in the formula (1). For example, the air density p may set at 1.20 [kg/m³], and the constant pressure specific heat $C_p$ at 1007 [J/kgK].

The microcomputer 7 obtains a current CPU ambient temperature from the CPU ambient temperature sensor 4 (Step S811). Then, the microcomputer 7 calculates a CPU ambient temperature rise amount obtained by subtracting the current CPU ambient temperature from the predicted CPU ambient temperature for each stage of the rotation number of the fan 5 and stores the CPU ambient temperature rise amount in the CPU temperature change prediction table 500 stored in the memory 6 (Step S812). At this time, when the CPU ambient temperature rise amount becomes a negative value, the CPU ambient temperature rise amount may be set to 0.

The microcomputer 7 obtains a current junction temperature from the internal temperature sensor 8 of the CPU 2 (Step S813). Then, the microcomputer 7 calculates a predicted CPU junction temperature obtained by adding the CPU ambient temperature rise amount and the current junction temperature for each stage of the rotation speed of the fan 5 and stores it in the CPU temperature change prediction table 500 stored in the memory 6 (Step S814).

Then, the microcomputer 7 determines the rotation number of the fan 5 so that the predicted CPU junction temperature does not exceed the temperature-specification upper limit value. More specifically, the microcomputer 7 determines the rotation number corresponding to the smallest stage in the rotation numbers corresponding to the stages at which the predicted CPU junction temperatures do not exceed the temperature-specification upper limit value of the CPU 2. Then, the microcomputer 7 outputs the PWM signal of the duty ratio corresponding to the determined rotation number to the fan 5 (Step S815) and finishes the processing.

Figure 9:
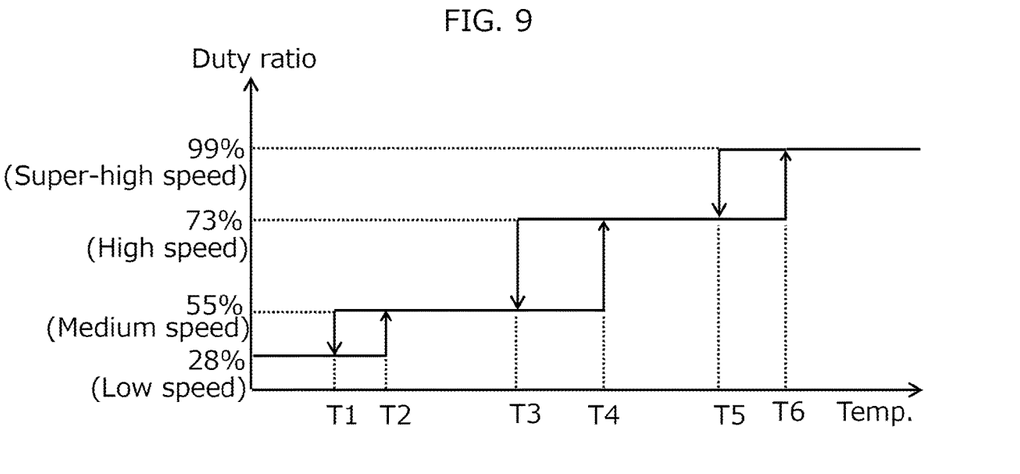
FIG. 9 is a diagram illustrating an example of a relationship between a rotation number of a fan and a predicted CPU junction temperature.

FIG. 9 is a diagram illustrating an example of a relationship between the rotation number of the fan 5 and the predicted CPU junction temperature. In FIG. 9, a lateral axis indicates the predicted CPU junction temperature, and a vertical axis indicates the duty ratio of the duty ratio of the PWM signal.

In the example in FIG. 9, in the case where the CPU ambient temperature rise amount is positive, if the predicted CPU junction temperature exceeds a threshold value temperature T2 when the fan 5 is at a low speed, the microcomputer 7 switches the fan 5 to a medium speed, if the predicted CPU junction temperature exceeds a threshold value temperature T4 when the fan 5 is at the medium speed, it switches the fan 5 to a high speed, and if the predicted CPU junction temperature exceeds a threshold value temperature T6 when the fan 5 is at a high speed, it switches the fan 5 to a super-high speed.

Moreover, in the case where the CPU ambient temperature rise amount is negative, if the predicted CPU junction temperature falls under a threshold value temperature T5 when the fan 5 is at the super-high speed, the microcomputer 7 switches the fan 5 to the high speed, if the predicted CPU junction temperature falls under a threshold value temperature T3 when the fan 5 is at the high speed, it switches the fan 5 to the medium speed, and if the predicted CPU junction temperature falls under a threshold value temperature T1 when the fan 5 is at the medium speed, it switches the fan 5 to the low speed.

The threshold value temperatures T1 to T6 satisfy T1<T2<T3<T4<T5<T6 and are set so that the junction temperature of the CPU 2 does not exceed the temperature-specification upper limit value. T1 and T2, T3 and T4, and T5 and T6 may be the same temperatures, respectively. Moreover, if the rotation number of the fan 5 is to be lowered, a conventional art may be used.

Figure 10:
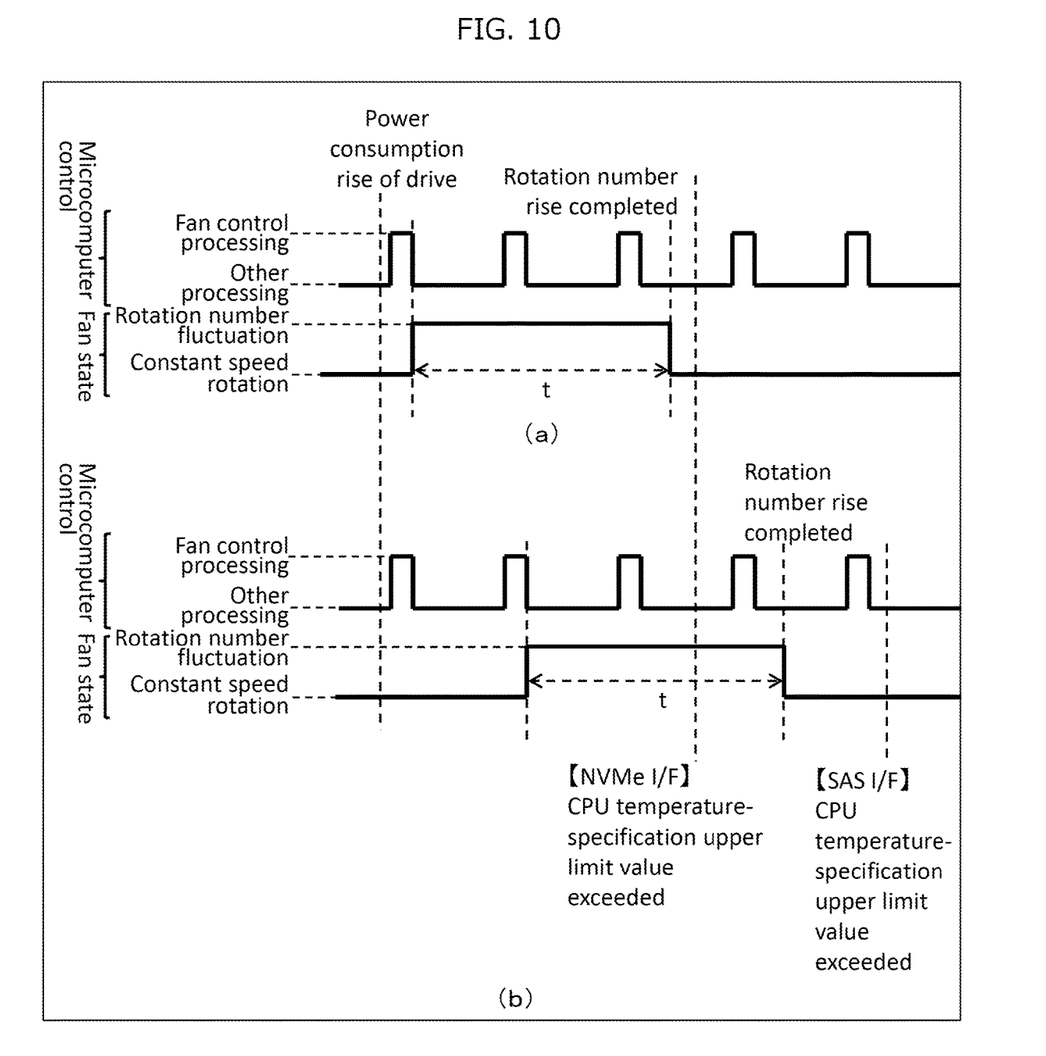
FIGS. 10(a) and 10(b) are diagrams for explaining examples of control timing of the fan.

FIGS. 10(a) and 10(b) are diagrams for explaining examples of control timing and a state of the fan. FIG. 10(a) illustrates the control timing and the state of the fan 5 in this embodiment, and FIG. 10(b) illustrates the control timing and the state of the fan 5 by the conventional art. The microcomputer 7 usually executes not only the fan control processing but also other processing and thus, the fan control processing is executed intermittently as illustrated in FIGS. 10(a) and 10(b).

In the conventional art illustrated in FIG. 10(b), the rotation number of the fan 5 is controlled only by the temperature of the CPU 2 without considering an influence of the contributing heat amount of the drive 1. Thus, in the fan control processing immediately after the rise of the power consumption of the drive 1, the rotation number of the fan 5 is not changed, and the change in the rotation number of the fan might be delayed in some cases. Moreover, since it takes a certain period of time t as a rotation number fluctuation period from the change in the duty ratio of the PWM signal till when the fan 5 reaches the desired rotation number, the junction temperature of the CPU 2 might exceed the temperature-specification upper limit value before the desired air flow is obtained in some cases. Even in the case where the junction temperature of the CPU 2 does not exceed the temperature-specification upper limit value when SASI/F with a small heat generation amount is employed as a communication I/F of the storage drive, for example, if an NVMeI/F with a large heat generation amount is employed, the junction temperature of the CPU 2 might exceed the temperature-specification upper limit value in some cases. The time when the temperature of the CPU 2 exceeds the temperature-specification upper limit value in FIGS. 10(a) and 10(b) indicates time when the temperature of the CPU 2 exceeds the temperature-specification upper limit value when the rotation number of the fan 5 has not reached constant-speed rotation.

On the other hand, since the microcomputer 7 in this embodiment controls the rotation number of the fan 5 by considering the contributing heat amount of the drive 1, the rotation number of the fan 5 can be changed in the fan control processing immediately after the power consumption of the drive 1 has risen as illustrated in FIG. 10(a). In this case, even if the NVMeI/F with the large heat generation amount is employed as the communication I/F of the storage drive, the junction temperature of the CPU 2 can be prevented from exceeding the temperature-specification upper limit value.

As described above, according to this embodiment, the microcomputer 7 calculates the predicted CPU ambient temperature which predicts the ambient temperature in the future by using the heat generation amount of the drive 1, the outside air temperature detected by the outside air temperature sensor 3, and the CPU ambient temperature detected by the CPU ambient temperature sensor 4. The microcomputer 7 controls the rotation number of the fan 5 on the basis of the predicted CPU ambient temperature so that the junction temperature of the CPU 2 does not exceed the temperature-specification upper limit value. Therefore, even if there is a heat source such as the drive 1, the rotation number of the fan 5 sending the outside air to the CPU 2 can be controlled by considering the heat generation amount of the heat source and thus, the temperature of the CPU 2 which is a temperature control target can be controlled as appropriate even if there is the heat source.

Moreover, in this embodiment, the drive 1 is provided between the inlet 11 which takes in the outside air to be sent to the CPU 2 by the fan 5 and the CPU 2. In this case, an influence on the temperature of the CPU 2 by the heat generation amount of the drive 1 becomes larger, but nonetheless, the temperature of the CPU 2 can be controlled as appropriate.

Moreover, in this embodiment, the microcomputer 7 calculates the predicted CPU ambient temperature for each of the plurality of stages obtained by dividing the rotation number of the fan 5 and controls the fan 5 by the rotation number corresponding to the smallest stage in the rotation numbers corresponding to the stages at which the junction temperature of the CPU 2 does not exceed the temperature-specification upper limit value on the basis of each of the predicted CPU ambient temperatures. Thus, the temperature of the CPU 2 can be controlled as appropriate while the rotation of the fan 5 more than necessary can be suppressed as appropriate.

Furthermore, in this embodiment, the microcomputer 7 calculates the predicted CPU ambient temperature by further using the mounting position of the drive 1 indicating the positional relationship between the drive 1 and the CPU 2. In this case, since the influence of the drive 1 on the junction temperature of the CPU 2 can be considered as appropriate, the temperature of the CPU 2 can be controlled more appropriately.

Furthermore, in this embodiment, the microcomputer 7 calculates the predicted CPU ambient temperature by calculating the contributing heat amount in the heat generation amount of the drive 1 contributing to the predicted CPU ambient temperature on the basis of the mounting position of the drive 1 and by using the contributing heat amount. Since the influence of the drive 1 on the junction temperature of the CPU 2 can be considered more appropriately, the temperature of the CPU 2 can be controlled more appropriately.

Furthermore, in this embodiment, the heat source is the drive 1 which stores data, and the temperature control target is the CPU 2 included in the storage controller for controlling the storage drive and thus, it can be applied to the storage apparatus.

The embodiment of this disclosure described above is exemplification for explanation of this disclosure and is not intended to limit the scope of this disclosure only to those embodiments. A person ordinarily skilled in the art can work this disclosure in the other various modes without departing from the scope of this disclosure.

For example, in the aforementioned embodiment, the storage apparatus 100 was used in the explanation as an electronic apparatus, but the electronic apparatus is not limited to the storage apparatus 100 but may be any electronic apparatus as long as it has a heat source separately from the temperature control target. Moreover, the positional relationship between the heat source and the temperature control target is not particularly limited, either.

What is claimed is:
1. An electronic apparatus, comprising:
   a heat source;
   a temperature control target;
   a cooling fan configured to send outside air to the temperature control target;
   an outside air detection unit configured to detect a temperature of outside air;
   an ambient temperature detection unit configured to detect a temperature in a vicinity of the temperature control target; and
   a control unit configured to:
      calculate a heat generation amount of the heat source based on a prestored heat generation coefficient indicating heat generation per unit of an electric power of the heat source according to a type of the heat source; and
      calculate a predicted ambient temperature which predicts the ambient temperature in a future by using the calculated heat generation amount of the heat source, a temperature of the outside air, and the ambient temperature and to control a rotation number of the cooling fan on a basis of the predicted ambient temperature such that the temperature of the temperature control target does not exceed a temperature-specification upper limit value.

2. The electronic apparatus according to claim 1, wherein the heat source is provided between an inlet configured to take in an outside air to be sent to the temperature control target by the cooling fan and the temperature control target.

3. The electronic apparatus according to claim 1, wherein the control unit calculates the predicted ambient temperature for each of a plurality of stages obtained by dividing a rotation number of the cooling fan and controls the cooling fan by the rotation number corresponding to a stage in rotation numbers corresponding to the stages at which a temperature of the temperature control target does not exceed the temperature-specification upper limit value on a basis of each of the predicted ambient temperatures.

4. The electronic apparatus according to claim 1, wherein the control unit calculates the predicted ambient temperature by further using a positional relationship between the heat source and the temperature control target.

5. The electronic apparatus according to claim 4, wherein the control unit calculates a contributing heat amount contributing to the predicted ambient temperature in the heat generation amount on the basis of the positional relationship and calculates the predicted ambient temperature by using the contributing heat amount.

6. The electronic apparatus according to claim 1, wherein the heat source is a storage drive configured to store data; and
   the temperature control target is a processor included in a storage controller configured to control the storage drive.

7. A fan control method by an electronic apparatus having a heat source, a temperature control target, a cooling fan for sending outside air to the temperature control target, an outside air temperature detection unit for detecting a temperature of the outside air, and an ambient temperature detection unit for detecting a temperature in a vicinity of the temperature control target, the fan control method comprising:
   calculating a heat generation amount of the heat source based on a prestored heat generation coefficient indicating heat generation per unit of an electric power of the heat source according to a type of the heat source;
   calculating a predicted ambient temperature which predicts the ambient temperature in a future by using the calculated heat generation amount of the heat source, the temperature of the outside air, and the ambient temperature; and determining a rotation number of the cooling fan on a basis of the predicted ambient temperature such that a temperature of the temperature control target does not exceed a temperature-specification upper limit value.

8. A non-transitory computer-readable, non-temporary, and tangible recording medium which records a program to cause a computer coupled to a heat source, a temperature control target, a cooling fan configured to send outside air to the temperature control target, an outside air temperature detection unit configured to detect a temperature of the outside air, and an ambient temperature detection unit configured to detect a temperature in a vicinity of the temperature control target, the program causing the computer to:

calculate a heat generation amount of the heat source based on a prestored heat generation coefficient indicating heat generation per unit of an electric power of the heat source according to a type of the heat source;

calculate a predicted ambient temperature which predicts the ambient temperature in a future by using the calculated heat generation amount of the heat source, a temperature of the outside air, and the ambient temperature; and determine a rotation number of the cooling fan on a basis of the predicted ambient temperature so that a temperature of the temperature control target does not exceed a temperature-specification upper limit value.

* * * * *